(12) United States Patent
Iwaya et al.

(10) Patent No.: US 10,453,954 B2
(45) Date of Patent: Oct. 22, 2019

(54) SEMICONDUCTOR DEVICE HAVING TRENCHES IN TERMINATION STRUCTURE REGION THEREOF AND METHOD FOR MANUFACTURING THE SAME

(71) Applicant: FUJI ELECTRIC CO., LTD., Kawasahi-shi, Kanagawa (JP)

(72) Inventors: Masanobu Iwaya, Matsumoto (JP); Yasuhiko Oonishi, Matsumoto (JP); Yusuke Kobayashi, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/022,633

(22) Filed: Jun. 28, 2018

(65) Prior Publication Data

US 2019/0035927 A1    Jan. 31, 2019

(30) Foreign Application Priority Data

Jul. 28, 2017   (JP) .................................. 2017-147252

(51) Int. Cl.
*H01L 29/78*       (2006.01)
*H01L 29/06*       (2006.01)
(Continued)

(52) U.S. Cl.
CPC ........ *H01L 29/7813* (2013.01); *H01L 21/046* (2013.01); *H01L 29/0623* (2013.01);
(Continued)

(58) Field of Classification Search
CPC ............. H01L 29/7823; H01L 29/7825; H01L 29/407
See application file for complete search history.

(56) References Cited

U.S. PATENT DOCUMENTS 8,704,295 B1 * 4/2014 Darwish ............. H01L 29/7806
257/330
2009/0134402 A1   5/2009 Yatsuo et al.
(Continued)

FOREIGN PATENT DOCUMENTS

JP       2006-147789 A      6/2006
JP       2010-045388 A      2/2010

OTHER PUBLICATIONS

K. Shenai, et al, "Optimum Semiconductors for High-Power Electronics", IEEE Transactions on Electron Devices, Sep. 1989, vol. 36, No. 9, pp. 1811-1823.
(Continued)

*Primary Examiner* — Quoc D Hoang
(74) *Attorney, Agent, or Firm* — Rabin & Berdo, P.C.

(57) ABSTRACT

In a termination structure region, a first semiconductor layer of a first conductivity type, with an impurity concentration lower than that of a semiconductor substrate, is provided on the substrate of the first conductivity type. A second semiconductor layer of a second conductivity type is provided on a first side of the first semiconductor layer, opposite to a second side facing the substrate. Trenches penetrate the second semiconductor layer. At the first side in the first semiconductor layer, a first semiconductor region of the second conductivity type, with an impurity concentration higher than that of the second semiconductor layer, is provided at a side closer to an active region, contacting the second semiconductor layer. A second semiconductor region of the first conductivity type is provided in the second semiconductor layer, outside and adjacent to one of the trenches that is disposed at a farthest position from the active region.

10 Claims, 15 Drawing Sheets

(51) Int. Cl.
  *H01L 29/10*    (2006.01)
  *H01L 29/417*   (2006.01)
  *H01L 29/08*    (2006.01)
  *H01L 29/16*    (2006.01)
  *H01L 29/66*    (2006.01)
  *H01L 21/04*    (2006.01)
  *H01L 29/423*   (2006.01)

(52) U.S. Cl.
  CPC ...... *H01L 29/0653* (2013.01); *H01L 29/0878* (2013.01); *H01L 29/1095* (2013.01); *H01L 29/1608* (2013.01); *H01L 29/41766* (2013.01); *H01L 29/4236* (2013.01); *H01L 29/66068* (2013.01)

(56) References Cited

U.S. PATENT DOCUMENTS

2010/0219417 A1   9/2010  Miura et al.
2013/0207172 A1*  8/2013  Hsieh ............... H01L 29/41766
                                                         257/315

OTHER PUBLICATIONS

B. Jayant Baliga, "Silicon Carbide Power Devices", USA, World Scientific Publishing Co., Mar. 30, 2006, p. 61-63.

* cited by examiner

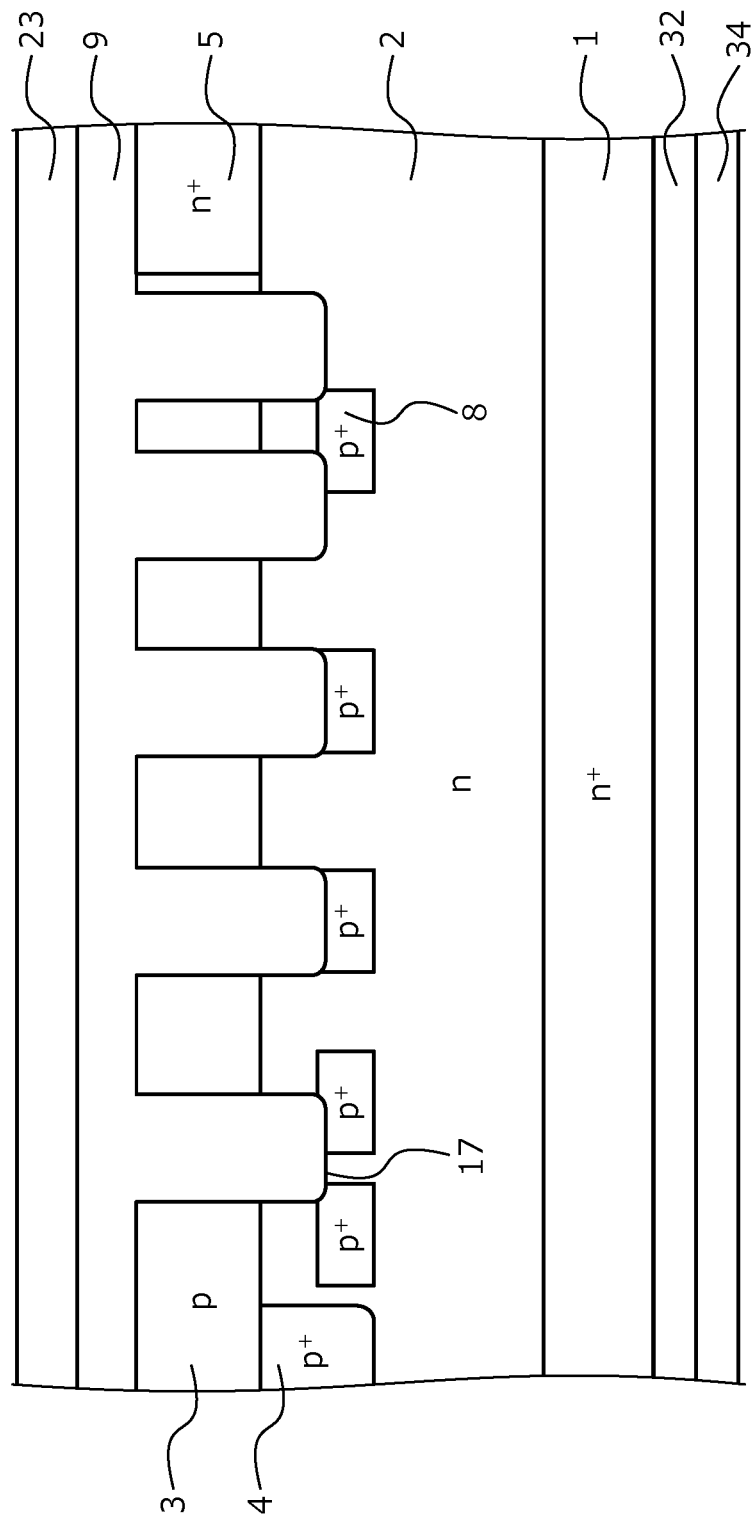

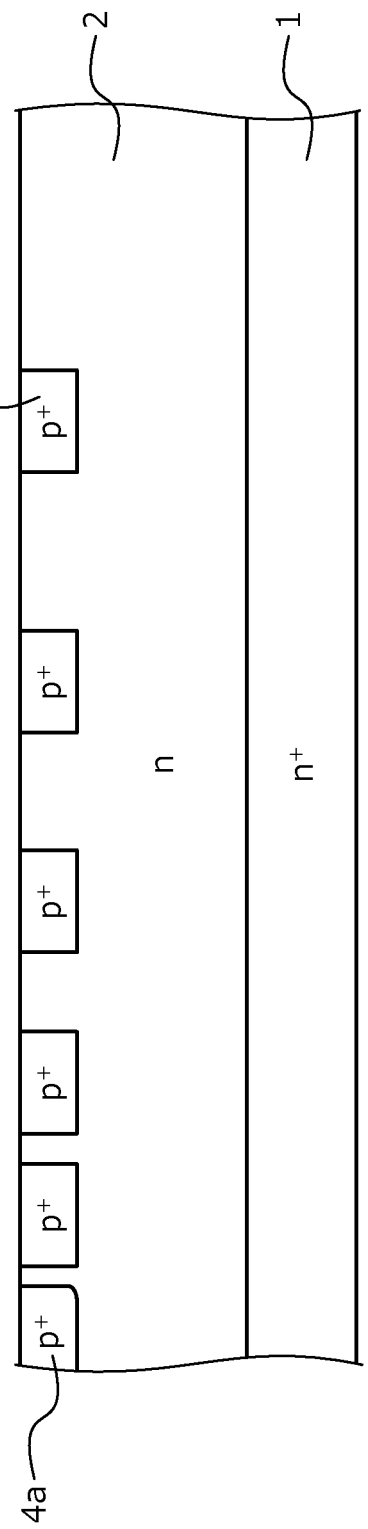

SEMICONDUCTOR DEVICE HAVING TRENCHES IN TERMINATION STRUCTURE REGION THEREOF AND METHOD FOR MANUFACTURING THE SAME

CROSS REFERENCE TO RELATED APPLICATIONS

This application is based upon and claims the benefit of priority of the prior Japanese Patent Application No. 2017-147252, filed on Jul. 28, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Silicon (Si) has been used as a constituent material of power semiconductor devices that control high voltage and/or large current. There are several types of power semiconductor devices such as bipolar transistors, insulated gate bipolar transistors (IGBTs), metal oxide semiconductor field effect transistors (MOSFETs), etc. These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. Therefore, in terms of power semiconductor devices, semiconductor materials replacing silicon have been investigated and silicon carbide (SiC) has been focused on as a semiconductor material enabling production (manufacture) of a next-generation power semiconductor device having low ON voltage, high-speed characteristics, and high-temperature characteristics (see, for example, K. Shenai, et al, "Optimum Semiconductors for High-Power Electronics", IEEE Transactions on Electron Devices, September 1989, Vol. 36, No. 9, pp. 1811-1823).

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than silicon (hereinafter, wide bandgap semiconductor material), such as gallium nitride (GaN). Thus, a high-voltage semiconductor device having low resistance can be achieved by using a wide bandgap semiconductor material (see, for example, B. Jayant Baliga, "Silicon Carbide Power Devices", USA, World Scientific Publishing Co., 2006 Mar. 30, p. 61).

Another semiconductor device realizing low resistance and high breakdown voltage has be proposed in which a portion (base region) forming a channel (inversion layer) is formed by epitaxial growth, whereby a crystalline property of the portion forming the channel is improved and high quality is facilitated (for example, refer to Japanese Laid-Open Patent Publication No. 2006-147789). In Japanese Laid-Open Patent Publication No. 2006-147789, low resistance and high quality are realized by increasing the crystalline property of the portion forming the channel and reducing the channel resistance.

As a semiconductor device in which a portion forming a channel is formed by epitaxial growth, a device has been proposed in which a p-type region is provided at a step that results near an interface of an active region and a termination structure region when in an epitaxial layer that includes the portion forming the channel, a portion in the termination structure region is removed. Thus, distribution of a p-type impurity at the step is gradual in a depth direction, electric field concentration at the step is mitigated, and decreases in breakdown voltage are prevented (for example, refer to Japanese Laid-Open Patent Publication No. 2010-045388).

SUMMARY OF THE INVENTION

According to an embodiment of the present invention, a semiconductor device includes an active region through which current flows; and a termination structure region disposed outside the active region and in which a termination structure is formed. The termination structure region includes a semiconductor substrate of a first conductivity type; a first semiconductor layer provided on a front surface of the semiconductor substrate, the first semiconductor layer having an impurity concentration that is lower than an impurity concentration of the semiconductor substrate; a second semiconductor layer of a second conductivity type provided on a surface on a first side of the first semiconductor layer, opposite a second side of the first semiconductor layer, the second side being toward the semiconductor substrate; a plurality of trenches penetrating the second semiconductor layer; a first semiconductor region of the second conductivity type provided at the surface on the first side of the first semiconductor layer so as to be in contact with the second semiconductor layer and to be toward the active region, the first semiconductor region having an impurity concentration that is higher than an impurity concentration of the second semiconductor layer; and a second semiconductor region of the first conductivity type provided at a surface of the second semiconductor layer, outside a trench that among the plurality of trenches, is farthest from the active region.

In the embodiment, the semiconductor device further includes a third semiconductor region of the second conductivity type provided in the first semiconductor layer so as to be in contact with the first semiconductor region in a lateral direction and to be positioned under the plurality of trenches and separated from the second semiconductor layer, the third semiconductor region having an impurity concentration that is lower than the impurity concentration of the first semiconductor region.

In the embodiment, the semiconductor device further includes a fourth semiconductor region of the second conductivity type provided so as to be in contact with the first semiconductor region in the lateral direction, to be in contact with the second semiconductor layer in an upward direction, and to be in contact with third semiconductor region in a downward direction, the fourth semiconductor region having an impurity concentration that is lower than the impurity concentration of the first semiconductor region.

In the embodiment, the semiconductor device further includes a plurality of fifth semiconductor regions of the second conductivity type selectively provided in the first semiconductor layer to be respectively positioned under each trench of the plurality of trenches and separated from the second semiconductor layer, the plurality of fifth semiconductor regions having an impurity concentration that is equal to the impurity concentration of the first semiconductor region.

In the embodiment, the plurality of trenches is provided so that an interval between trenches decreases with increasing distance of the trenches from the active region.

In the embodiment, each trench of the plurality of trenches is embedded with an insulating film.

According to another embodiment, a method of manufacturing a semiconductor device having an active region through which current flows, and a termination structure region disposed outside the active region and in which a termination structure is formed, includes forming a first semiconductor layer of a first conductivity type on a front surface of a semiconductor substrate of the first conductivity type, the first semiconductor layer having an impurity concentration that is lower than an impurity concentration of the semiconductor substrate; forming a first semiconductor region of a second conductivity type toward the active region, at a surface on a first side of the first semiconductor layer, opposite a second side of the first semiconductor layer, the second side being toward the semiconductor substrate; forming a second semiconductor layer of the second conductivity type on the surface on the first side of the first semiconductor layer; forming a second semiconductor region of the first conductivity type at a surface of the second semiconductor layer, at a position separated from the active region; and forming a trench in a region in which the first semiconductor region is not formed, the trench penetrating the second semiconductor layer.

In the embodiment, forming the first semiconductor region includes forming a third semiconductor region of the second conductivity type in the first semiconductor layer so as to be in contact with the first semiconductor region in a lateral direction, the third semiconductor region having an impurity concentration that is lower than an impurity concentration of the first semiconductor region.

In the embodiment, forming the first semiconductor region includes forming a fourth semiconductor region of the second conductivity type in the first semiconductor layer so as to be in contact with the first semiconductor region in the lateral direction and so as to be in contact with the third semiconductor region in a downward direction, the fourth semiconductor region having an impurity concentration that is lower than the impurity concentration of the first semiconductor region.

In the embodiment, forming the first semiconductor region includes selectively forming a fifth semiconductor region of the second conductivity type in the first semiconductor layer, the fifth semiconductor region having an impurity concentration that is equal to an impurity concentration of the first semiconductor region.

In the embodiment, the fifth semiconductor region is formed at a same process as the first semiconductor region.

In the embodiment, forming the trench includes forming the trench in the termination structure region and forming a trench gate in the active region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 17 is a cross-sectional view of a configuration of the termination structure region of the silicon carbide semiconductor device according to a fourth embodiment; and FIG. 18 is a cross-sectional view schematically depicting the termination structure region of the silicon carbide semiconductor device according to the fourth embodiment during manufacture.

DETAILED DESCRIPTION OF THE INVENTION

Figure 1:
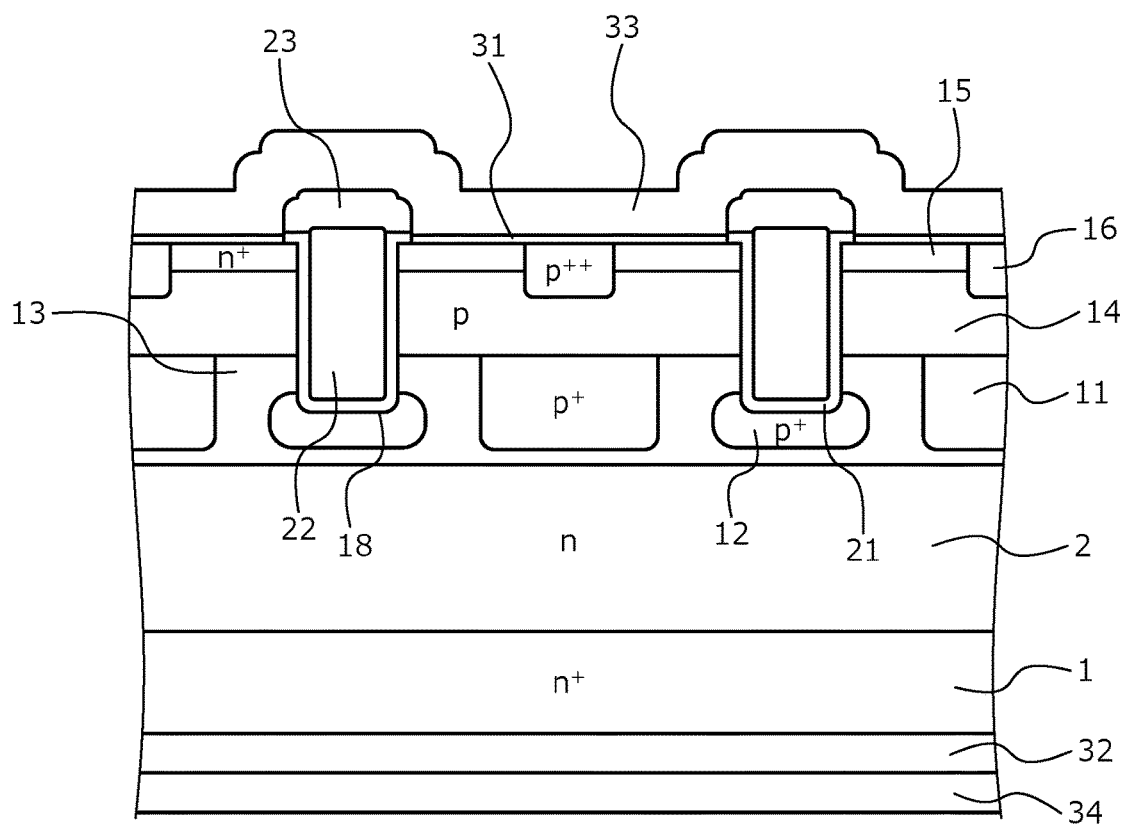
FIG. 1 is a cross-sectional view of a configuration of an active region of a silicon carbide semiconductor device according to a first embodiment.

First, problems associated with the related arts will be described. In Japanese Laid-Open Patent Publication No.

2006-147789 and Japanese Laid-Open Patent Publication No. 2010-045388, in the epitaxial layer that includes the portion forming the channel, while a portion (i.e., portion in the termination structure region) other than the active region is unnecessary in terms of current flow, partial removal is necessary to form the termination structure region. Therefore, a problem arises in that the breakdown voltage decreases due to adverse effects of variation in the etching for removing the epitaxial layer and the shape of the step resulting near the interface of the active region and the termination structure region, and a further problem arises in that the step affects a subsequent photolithography process, causing the processing accuracy thereof to decrease.

Embodiments of a semiconductor device and method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index.

The semiconductor device according to the embodiments of the present invention is formed using a wide bandgap semiconductor material. In a first embodiment, a silicon carbide semiconductor device fabricated using, for example, silicon carbide (SiC) as the wide bandgap semiconductor material will be described taking a MOSFET as an example.

FIG. 1 is a cross-sectional view of a configuration of an active region of the silicon carbide semiconductor device according to the first embodiment. The active region is a region in which an element structure is formed and through which current flows during an ON state. As depicted in FIG. 1, in the active region of the silicon carbide semiconductor device according to the first embodiment, on a first main surface, for example (0001) plane (Si face) of an $n^+$-type silicon carbide substrate (semiconductor substrate of a first conductivity type) 1, an n-type silicon carbide epitaxial layer (first semiconductor layer of the first conductivity type) 2 is deposited.

The $n^+$-type silicon carbide substrate 1 is a silicon carbide single crystal substrate doped with, for example, nitrogen (N). The n-type silicon carbide epitaxial layer 2 has an impurity concentration that is lower than an impurity concentration of the $n^+$-type silicon carbide substrate 1 and is a low-concentration n-type drift layer doped with, for example, nitrogen. A dense n-type region 13 is formed on a first main surface side of the n-type silicon carbide epitaxial layer 2. The dense n-type region 13 has an impurity concentration that is lower than the impurity concentration of the $n^+$-type silicon carbide substrate 1 and higher than the impurity concentration of the n-type silicon carbide epitaxial layer 2 and is doped with, for example, nitrogen. Hereinafter, the $n^+$-type silicon carbide substrate 1 and the n-type silicon carbide epitaxial layer 2 together with a p-type base layer 14 described hereinafter are regarded as a silicon carbide semiconductor base.

As depicted in FIG. 1, on a surface (rear surface of the silicon carbide semiconductor base) of the $n^+$-type silicon carbide substrate 1 opposite the first main surface, a rear electrode 32 is provided. The rear electrode 32 constitutes a drain electrode. At a surface of the rear electrode 32, a drain electrode pad 34 is provided.

At a first main surface side of the silicon carbide semiconductor base, a trench structure is formed. In particular, a trench gate 18 penetrates the p-type base layer 14, from a surface on a first side of (the first main surface side of the silicon carbide semiconductor base) of the p-type base layer 14, opposite a second side thereof facing toward the $n^+$-type silicon carbide substrate 1. Along a surface of the trench gate 18, a gate insulating film 21 is formed at a side and a bottom of the trench gate 18, and a gate electrode 22 insulated from the n-type silicon carbide epitaxial layer 2 and the p-type base layer 14 by the gate insulating film 21 is formed in the trench gate 18. A portion of the gate electrode 22 may protrude outside the trench gate 18.

A first $p^+$-type base region 11 and a second $p^+$-type base region 12 are selectively provided in a surface layer on a first side (the first main surface side of the silicon carbide semiconductor base) of the n-type silicon carbide epitaxial layer 2, opposite a second side of the n-type silicon carbide epitaxial layer 2 facing toward the $n^+$-type silicon carbide substrate 1. The second $p^+$-type base region 12 is formed under the trench gate 18 and a width of the second $p^+$-type base region 12 is wider than a width of the trench gate 18. The first $p^+$-type base region 11 and the second $p^+$-type base region 12 are doped with, for example, aluminum (Al). A portion of the first $p^+$-type base region 11 may extend toward the trench gate 18 to be connected with the second $p^+$-type base region 12. A reason for this is that holes generated when avalanche breakdown occurs at a junction of the n-type silicon carbide epitaxial layer 2 and second $p^+$-type base region 12 under the trench gate 18 are efficiently migrated to a source electrode, whereby load on a gate oxide film may be reduced, increasing reliability.

On the first side of the n-type silicon carbide epitaxial layer 2, the p-type base layer 14 is provided, and at the first side of the p-type base layer 14, an $n^+$-type source region 15 and a $p^{++}$-type contact region 16 are provided. Further, the $n^+$-type source region 15 and the $p^{++}$-type contact region 16 are in contact with each other. In a region of the surface layer of the n-type silicon carbide epitaxial layer 2 between the first $p^+$-type base region 11 and the second $p^+$-type base region 12, and in a region thereof between the p-type base layer 14 and the second $p^+$-type base region 12, the dense n-type region 13 is provided. The dense n-type region 13 is provided to a position deeper than that of the first $p^+$-type base region 11 and that of the second $p^+$-type base region 12.

In FIG. 1, while only two trench MOS structures are depicted, further MOS gate (insulated gate using a metal-oxide film-semiconductor) structures having a trench structure may be arranged in parallel.

An interlayer insulating film 23 is provided on the entire first main surface side of the silicon carbide semiconductor base, so as to be cover the gate electrode 22 embedded in the trench gate 18. A source electrode 31 is in contact with the $n^+$-type source region 15 and the $p^{++}$-type contact region 16, via a contact hole opened in the interlayer insulating film 23. The source electrode 31 is electrically insulated from the gate electrode by the interlayer insulating film 23. On the source electrode 31, a source electrode pad 33 is provided.

Figure 2:
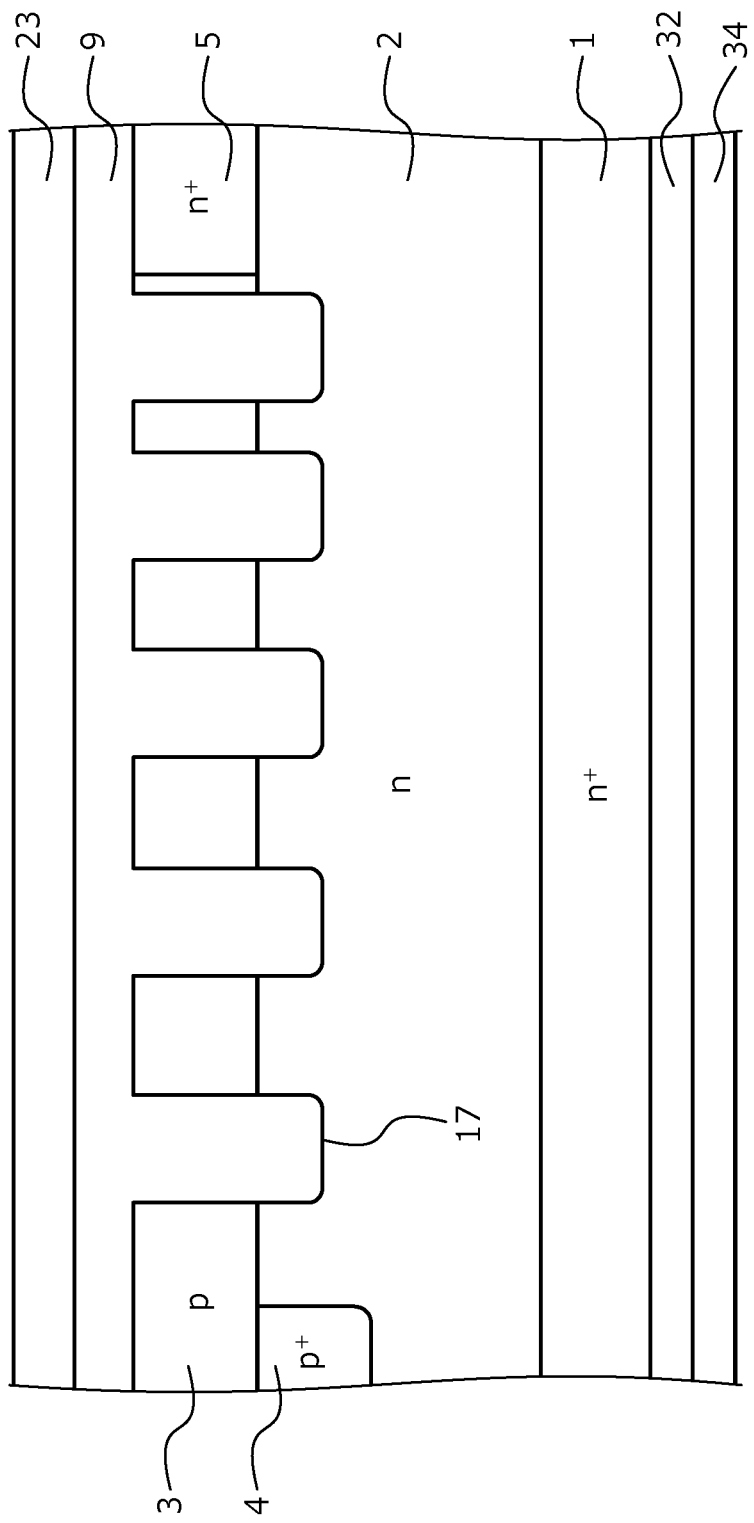
FIG. 2 is a cross-sectional view of a configuration of a termination structure region the silicon carbide semiconductor device according to the first embodiment.

FIG. 2 is a cross-sectional view of a configuration of a termination structure region the silicon carbide semiconductor device according to the first embodiment. The termination structure region is an edge region that surrounds a periphery of the active region and sustains the breakdown voltage. As depicted in FIG. 2, the n-type silicon carbide epitaxial layer 2 is deposited on the first main surface of the n$^+$-type silicon carbide substrate 1. Configuration is similar to that in the active region. Hereinafter, in the termination structure region, the n$^+$-type silicon carbide substrate 1, the n-type silicon carbide epitaxial layer 2, and a later-described p-type base layer 3 are collectively regarded as the silicon carbide semiconductor base.

As depicted in FIG. 2, on the surface (rear surface of the silicon carbide semiconductor base) of the n$^+$-type silicon carbide substrate 1 opposite the first main surface, the rear electrode 32 is provided. The rear electrode 32 constitutes the drain electrode. At the surface of the rear electrode 32, the drain electrode pad 34 is provided.

At the first main surface side of the silicon carbide semiconductor base, a trench structure is formed. In particular, a trench 17 penetrates the p-type base layer (second semiconductor layer of a second conductivity type) 3, from a surface on a first side (the first main surface side of the silicon carbide semiconductor base) of the p-type base layer 3, opposite a second side of the p-type base layer 3 facing toward the n$^+$-type silicon carbide substrate 1. In the trench 17, a field oxide film 9 may be embedded. Further, the trench 17 may be provided at intervals that decrease with increasing distance from the active region.

In the surface layer on the first side (the first main surface side of the silicon carbide semiconductor base) of the n-type silicon carbide epitaxial layer 2, a termination-structure-region p$^+$-type base region (first semiconductor region of the second conductivity type) 4 is provided toward the active region and is doped with, for example, aluminum. On the first side of the n-type silicon carbide epitaxial layer 2, the p-type base layer 3 is provided, and at the first side of the p-type base layer 3, an n$^+$-type channel stopper region (second semiconductor region of the first conductivity type) 5 is provided at a location separated from the active region of the first main surface side. The interlayer insulating film 23 is provided on the entire surface on first main surface side of the silicon carbide semiconductor base.

A method of manufacturing the silicon carbide semiconductor device according to the first embodiment will be described. FIGS. 3, 4, 5, 6, 7, and 8 are cross-sectional views of a structure of the active region of the silicon carbide semiconductor device according to the first embodiment.

Figure 3:
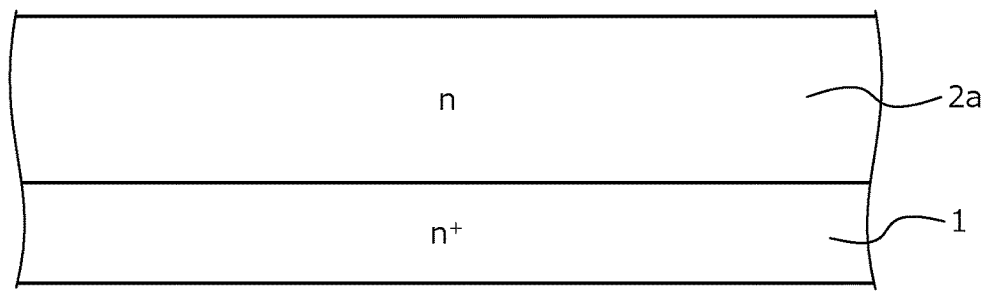
FIG. 3 is a cross-sectional view of a structure of an active region of the silicon carbide semiconductor device according to the first embodiment.

First, as depicted in FIG. 3, the n$^+$-type silicon carbide substrate 1 containing an n-type silicon carbide is prepared. Next, on the first main surface of the n$^+$-type silicon carbide substrate 1, a first n-type silicon carbide epitaxial layer 2a containing silicon carbide is formed by epitaxial growth to have a thickness of, for example, about 10 μm while an n-type impurity, for example, nitrogen atoms, is doped. The first n-type silicon carbide epitaxial layer 2a constitutes the n-type silicon carbide epitaxial layer 2. The state up to here is depicted in FIG. 3.

Figure 4:
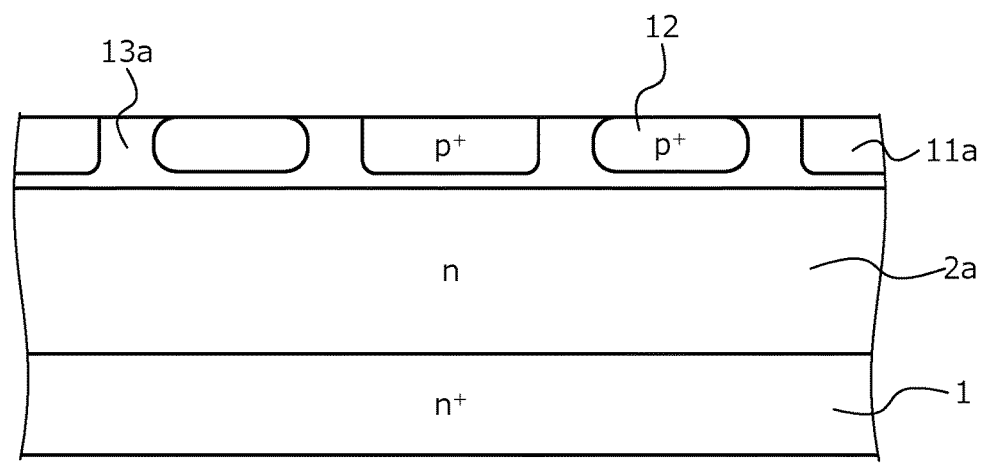
FIG. 4 is a cross-sectional view of the structure of the active region of the silicon carbide semiconductor device according to the first embodiment.

Next, as depicted in FIG. 4, on a surface of the first n-type silicon carbide epitaxial layer 2a, by a photolithographic technique, a non-depicted mask having predetermined openings is formed using, for example, an oxide film. Subsequently, by ion implantation, a p-type impurity, for example, aluminum atoms, is ion implanted. As a result, as depicted in FIG. 4, in some surface regions of the first n-type silicon carbide epitaxial layer 2a, for example, a deep first p$^+$-type base region 11a having a depth of about 0.5 μm and the second p$^+$-type base region 12 are formed so that, for example, a distance between the deep first p$^+$-type base region 11a and the adjacent second p$^+$-type base region 12 is in a range from about 1 to 1.5 μm. Further, a dose amount at the time of ion implantation for forming the deep first p$^+$-type base region 11a and the second p$^+$-type base region 12 may be set so that, for example, impurity concentrations thereof are in a range of about $1 \times 10^{18}$ to $1 \times 10^{19}$/cm$^3$. Next, the mask used during the ion implantation for forming the deep first p$^+$-type base region 11a and the second p$^+$-type base region 12 is removed. Next, by ion implantation, an n-type impurity, for example, nitrogen atoms are ion implanted. As a result, as depicted in FIG. 4, in a surface region of the first n-type silicon carbide epitaxial layer 2a, a deep, dense n-type region 13a is formed to a position deeper than that of the deep first p$^+$-type base region 11a and that of the second p$^+$-type base region 12. A dose amount at the time of ion implantation for forming the deep, dense n-type region 13a may be set so that, for example, an impurity concentration thereof is in a range from about $5 \times 10^{16}$ to $5 \times 10^{17}$/cm$^3$. The state up to here is depicted in FIG. 4.

Figure 5:
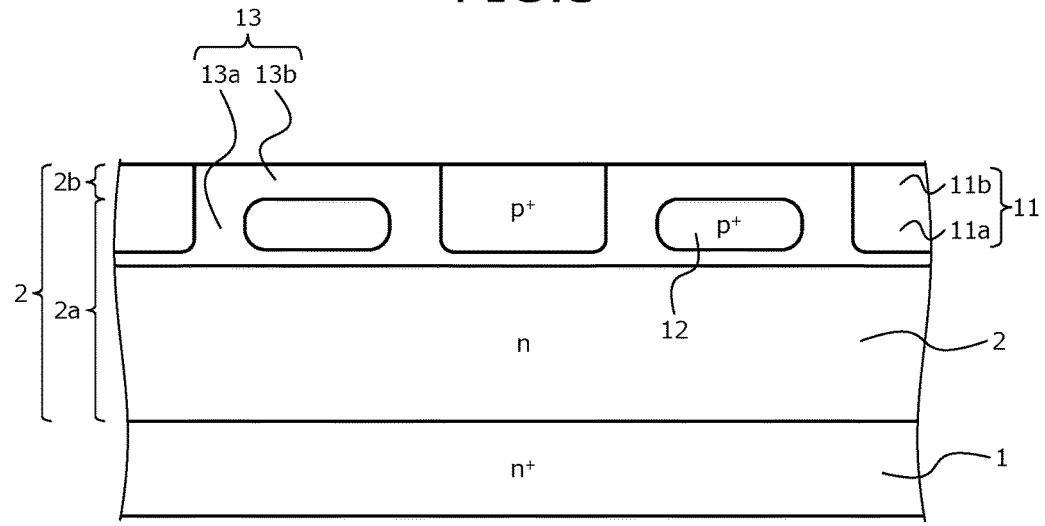
FIG. 5 is a cross-sectional view of the structure of the active region of the silicon carbide semiconductor device according to the first embodiment.

Next, as depicted in FIG. 5, on a surface of the first n-type silicon carbide epitaxial layer 2a, a second n-type silicon carbide epitaxial layer 2b is formed by epitaxial growth to have a thickness of, for example, about 0.5 μm, while an n-type impurity, for example, nitrogen atoms, is doped. The second n-type silicon carbide epitaxial layer 2b and the first n-type silicon carbide epitaxial layer 2a combined form the n-type silicon carbide epitaxial layer 2. Conditions of the epitaxial growth for forming the second n-type silicon carbide epitaxial layer 2b may be set so that, for example, an impurity concentration of the second n-type silicon carbide epitaxial layer 2b becomes about $8 \times 10^{15}$/cm$^3$.

Next, on the surface of the n-type silicon carbide epitaxial layer 2, by a photolithographic technique, a non-depicted mask having predetermined openings is formed using, for example, an oxide film. Next, by ion implantation, a p-type impurity, for example, aluminum atoms, is ion implanted. As a result, as depicted in FIG. 5, in some surface regions of the n-type silicon carbide epitaxial layer 2, a shallow first p$^+$-type base region 11b having a depth of, for example, about 0.5 μm is formed. Each shallow first p$^+$-type base region 11b is formed so as to, for example, overlap a top of one of the deep first p$^+$-type base regions 11a. The shallow first p$^+$-type base region 11b and the deep first p$^+$-type base region 11a combined form the first p$^+$-type base region 11. A dose amount at the time of ion implantation for forming the shallow first p$^+$-type base region 11b may be so that, for example, an impurity concentration thereof is in a range from about $1 \times 10^{18}$ to $1 \times 10^{19}$/cm$^3$. Next, the mask used during the ion implantation for forming the shallow first p$^+$-type base region 11b is removed. Next, by ion implantation, an n-type impurity, for example, nitrogen atoms, is ion implanted. As a result, as depicted in FIG. 5, in some surface regions of the second n-type silicon carbide epitaxial layer 2b, a shallow, dense n-type region 13b having a thickness of, for example, about 0.5 μm is formed. A dose amount at the time of ion implantation for forming the shallow, dense n-type region 13b may be set so that, for example, an impurity concentration thereof is in a range from about $5 \times 10^{16}$ to $5 \times 10^{17}$/cm$^3$. The shallow, dense n-type region 13b and the deep, dense n-type region 13a combined form the dense n-type region 13. The state up to here is depicted in FIG. 5.

Next, on the surface of the n-type silicon carbide epitaxial layer 2, the p-type base layer 14 is formed by epitaxial growth to have a thickness in a range, for example, from about 0.7 to 1.3 μm, while a p-type impurity, for example, aluminum atoms, is doped. Conditions of the epitaxial growth for forming the p-type base layer 14 may be set so that, for example, an impurity concentration thereof is in a range from about $1\times10^{16}$ to $5\times10^{18}/cm^3$.

Figure 6:
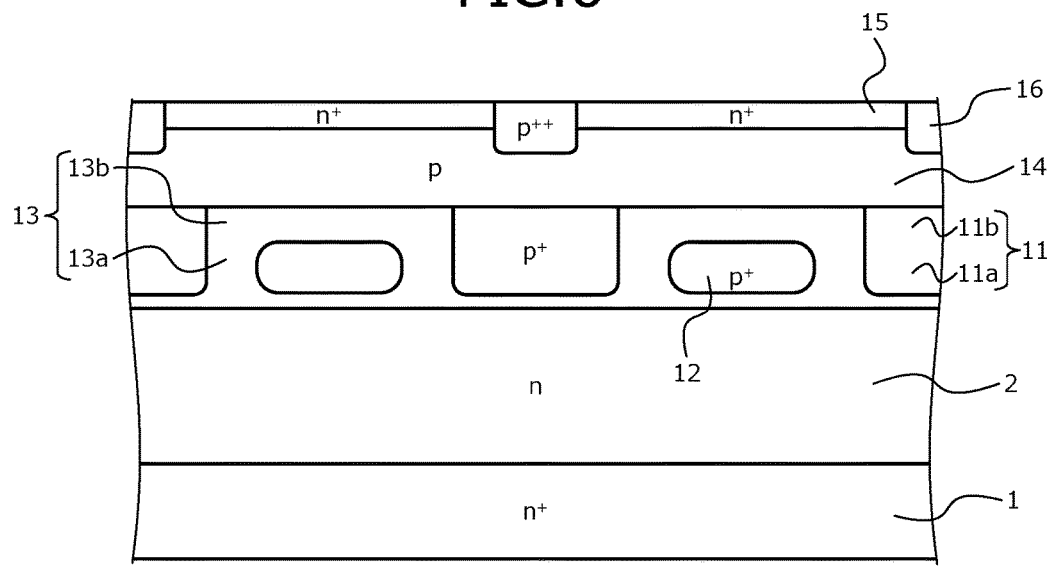
FIG. 6 is a cross-sectional view of the structure of the active region of the silicon carbide semiconductor device according to the first embodiment.

Next, on a surface of the exposed p-type base layer 14, by a photolithographic technique, a non-depicted mask having predetermined openings is formed using, for example, an oxide film. Next, by ion implantation, an n-type impurity, for example, phosphorus, is ion implanted. As a result, as depicted in FIG. 6, in some surface regions of the p-type base layer 14, the $n^+$-type source region 15 is formed. A dose amount at the time of ion implantation for forming the $n^+$-type source region 15 may be set so that, for example, an impurity concentration thereof becomes higher than that of the $p^+$-type base region 12. Next, the mask used during the ion implantation for forming the $n^+$-type source region 15 is removed.

Next, on the surface of the exposed p-type base layer 14, by a photolithographic technique, a non-depicted mask having predetermined openings is formed using, for example, an oxide film and at the surface of the p-type base layer 14, a p-type impurity, for example, aluminum, is ion implanted. As a result, as depicted in FIG. 6, in some surface regions of the p-type base layer 14, the $p^{++}$-type contact region 16 is formed. A dose amount at the time of ion implantation for forming the $p^{++}$-type contact region 16 may be set so that, for example, an impurity concentration thereof becomes higher than that of the second $p^+$-type base region 12. Subsequently, the mask used during the ion implantation for forming the $p^{++}$-type contact region 16 is removed. The state up to here is depicted in FIG. 6.

Next, heat treatment (annealing) is performed, activating, for example, the first $p^+$-type base region 11, the second $p^+$-type base region 12, the $n^+$-type source region 15, and the $p^{++}$-type contact region 16. A temperature of the heat treatment may be, for example, about 1700 degrees C. A period of the heat treatment may be, for example, about 2 minutes. As described, the ion implanted regions may be collectively activated by a single session of heat treatment, or the heat treatment may be performed each time ion implantation is performed.

Figure 7:
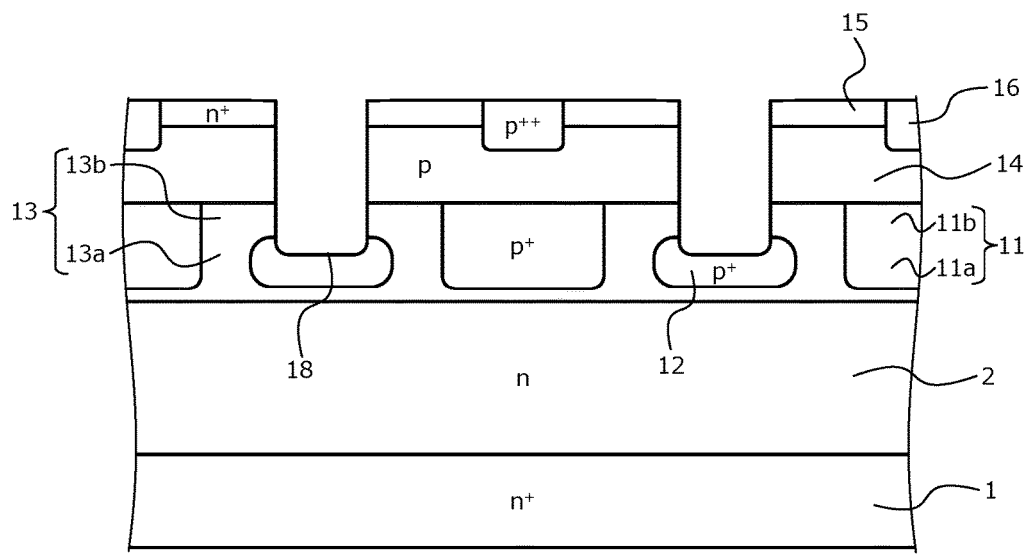
FIG. 7 is a cross-sectional view of the structure of the active region of the silicon carbide semiconductor device according to the first embodiment.

Next, as depicted in FIG. 7, on the surface of the exposed p-type base layer 14, by a photolithographic technique, a non-depicted mask having predetermined openings is formed using, for example, an oxide film. Next, by dry etching, the trench gate 18 is formed penetrating the p-type base layer 14 and reaching the n-type silicon carbide epitaxial layer 2. The bottom of the trench gate 18 may reach the second $p^+$-type base region 12, or may be disposed in the n-type silicon carbide epitaxial layer 2 between the p-type base layer 14 and the second $p^+$-type base region 12. Subsequently, the mask used for forming the trench gate 18 is removed. The state up to here is depicted in FIG. 7.

Figure 8:
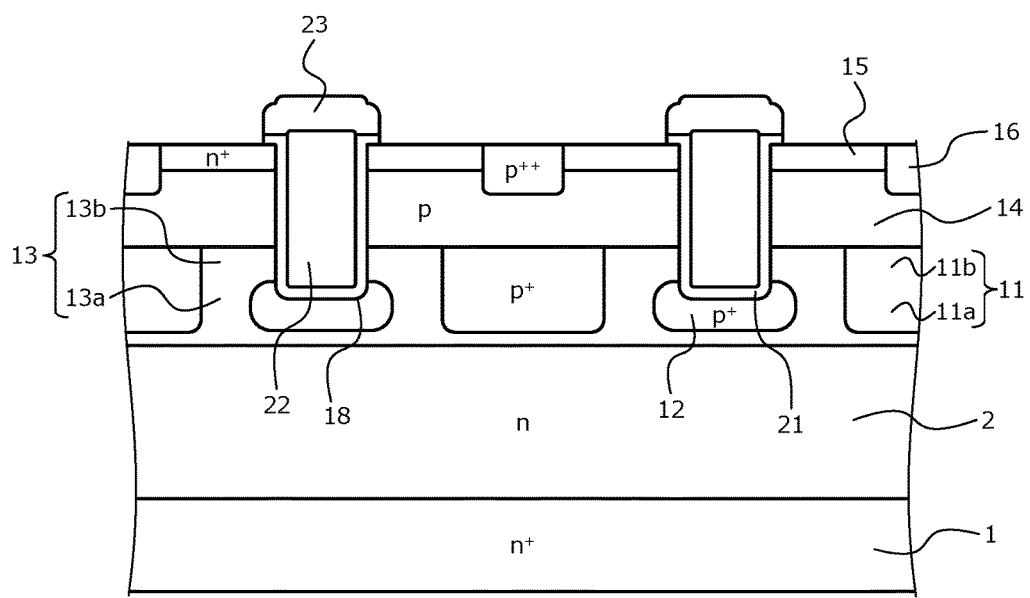
FIG. 8 is a cross-sectional view of the structure of the active region of the silicon carbide semiconductor device according to the first embodiment.

Next, as depicted in FIG. 8, the gate insulating film 21 is formed at the bottom and the sides of the trench gate 18 along surfaces of the $n^+$-type source region 15 and the trench gate 18. The gate insulating film 21 may be formed by thermal oxidation by heat treatment at a temperature of about 1000 degrees C. in an oxygen atmosphere. Further, the oxide film may be formed by a method of deposition by a chemical reaction such as for a high temperature oxide (HTO).

Next, on the gate insulating film 21, a polycrystalline silicon layer doped with, for example, phosphorus atoms (P), is formed. The polycrystalline silicon layer may be formed so as to fill the trench gate 18. The polycrystalline silicon layer is patterned so as to remain in the trench gate 18, whereby the gate electrode 22 is formed. A portion of the gate electrode 22 may protrude outside the trench gate 18.

Next, for example, a phosphorus glass is deposited to a thickness of about 1 μm, so as to cover the gate insulating film 21 and the gate electrode 22, thereby forming the interlayer insulating film 23. The interlayer insulating film 23 and the gate insulating film 21 are patterned and selectively removed, thereby forming contact holes and exposing the $n^+$-type source region 15 and the $p^{++}$-type contact region 16. Thereafter, heat treatment (reflow) is performed, planarizing the interlayer insulating film 23. The state up to here is depicted in FIG. 8.

Next, in the contact holes and on the interlayer insulating film 23, a conductive film constituting the source electrode 31 is formed. The conductive film is selectively removed, leaving, for example, the source electrode 31 only in the contact holes.

Next, on a second main surface of the $n^+$-type silicon carbide substrate 1, the rear electrode 32 constituted by, for example, a nickel (Ni) film is formed. Thereafter, for example, heat treatment at a temperature of about 970 degrees C. is performed, forming an ohmic junction between the $n^+$-type silicon carbide semiconductor substrate 1 and the rear electrode 32.

Next, as depicted in FIG. 1, for example, by a sputtering method, for example, an aluminum film is formed so as to have a thickness of, for example, about 5 μm and to cover the source electrode 31 and the interlayer insulating film 23. Thereafter, the Al film is selectively removed so as to remain covering the active region of the elements overall, whereby the source electrode pad 33 is formed.

Next, on a surface of the rear electrode 32, for example, titanium (Ti), nickel, and gold (Au) are sequentially stacked in order stated, forming the drain electrode pad 34. Thus, the active region of the silicon carbide semiconductor device depicted in FIG. 1 is completed.

FIGS. 9, 10, 11, and 12 are cross-sectional views schematically depicting the termination structure region of the silicon carbide semiconductor device according to the first embodiment during manufacture.

Figure 9:
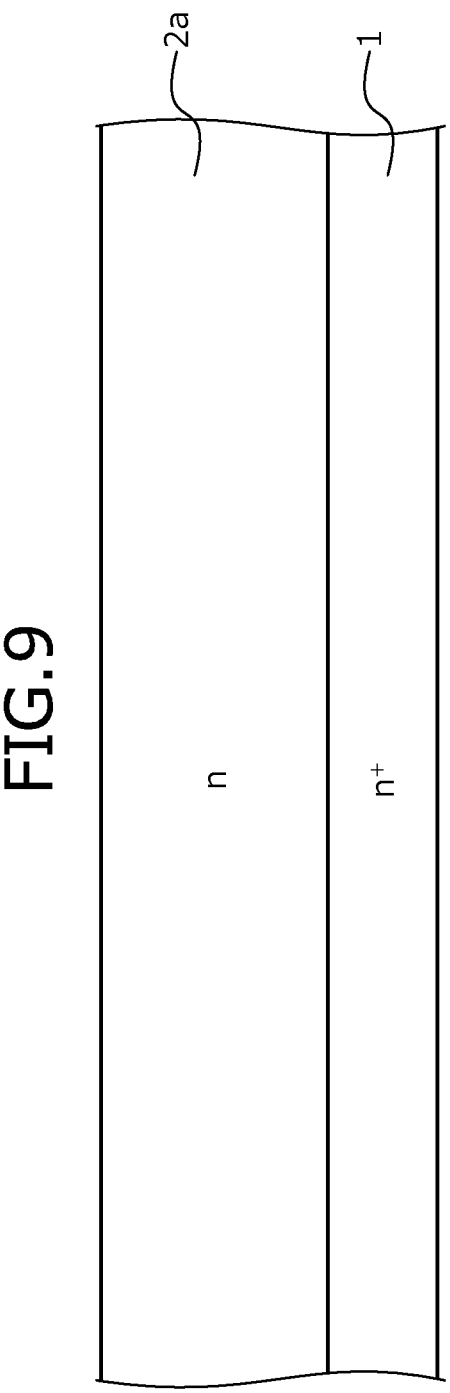
FIG. 9 is a cross-sectional view schematically depicting a termination structure region of the silicon carbide semiconductor device according to the first embodiment during manufacture.

First, as depicted in FIG. 9, the $n^+$-type silicon carbide substrate 1 containing an n-type silicon carbide is prepared. Subsequently, on the first main surface of the $n^+$-type silicon carbide substrate 1, the first n-type silicon carbide epitaxial layer 2a containing silicon carbide is formed by epitaxial growth to have a thickness of, for example, about 10 μm, while an n-type impurity, for example, nitrogen atoms, is doped. The first n-type silicon carbide epitaxial layer 2a constitutes the n-type silicon carbide epitaxial layer 2. The state up to here is depicted in FIG. 9.

Figure 10:
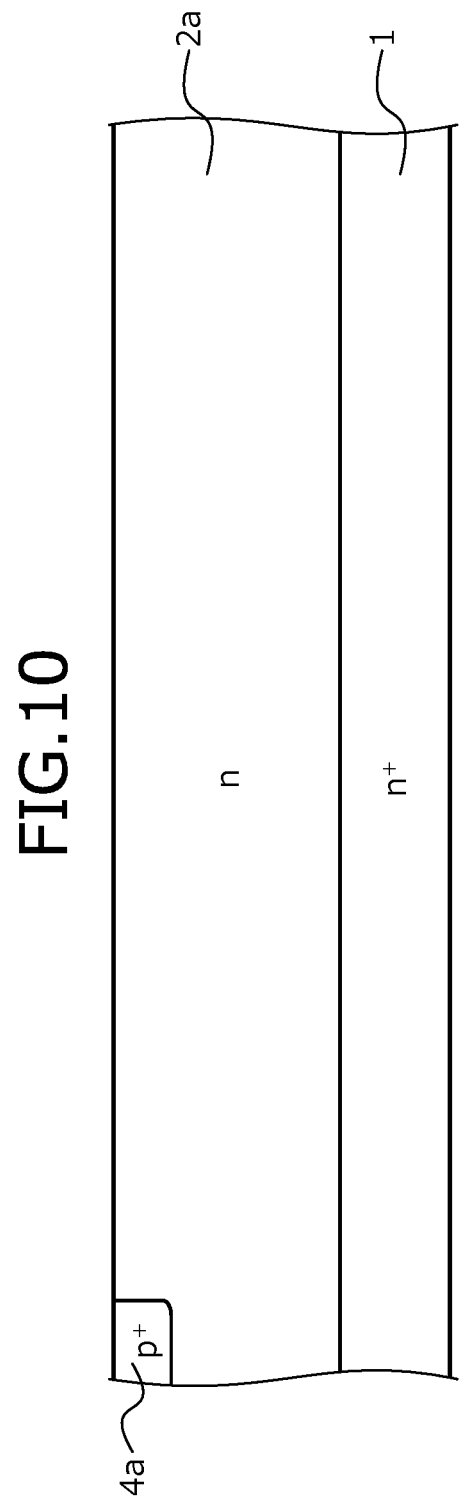
FIG. 10 is a cross-sectional view schematically depicting the termination structure region of the silicon carbide semiconductor device according to the first embodiment during manufacture.

Next, as depicted in FIG. 10, on the surface of the first n-type silicon carbide epitaxial layer 2a, by a photolithographic technique, a non-depicted mask having a predetermined opening is formed using, for example, an oxide film. Subsequently, by ion implantation, a p-type impurity, for example, aluminum atoms, is ion implanted. As a result, as depicted in FIG. 10, in a surface region of the first n-type silicon carbide epitaxial layer 2a, for example, a deep termination-structure-region $p^+$-type base region 4a having a depth of about 0.5 μm is formed. Further, a dose amount at the time of ion implantation for forming the deep termination-structure-region $p^+$-type base region 4a may be set so that an impurity concentration thereof is in a range, for example, from about $1\times10^{18}$ to $1\times10^{19}/cm^3$. Next, the mask used during the ion implantation for forming the deep termination-structure-region $p^+$-type base region 4a is removed. The state up to here is depicted in FIG. 10.

Figure 11:
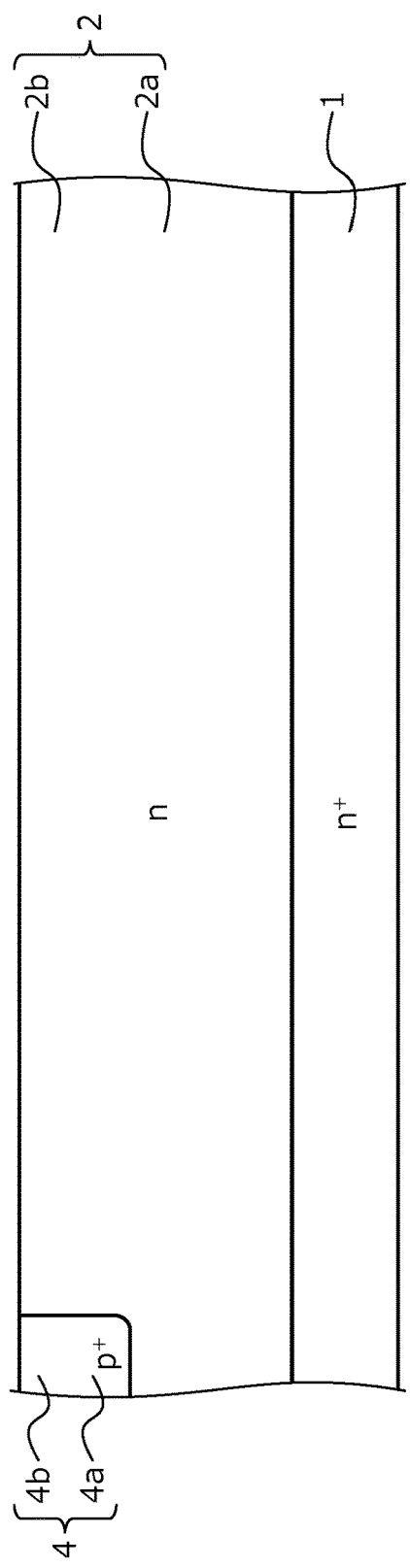
FIG. 11 is a cross-sectional view schematically depicting the termination structure region of the silicon carbide semiconductor device according to the first embodiment during manufacture.

Next, as depicted in FIG. 11, on the surface of the first n-type silicon carbide epitaxial layer 2a, the second n-type silicon carbide epitaxial layer 2b is formed by epitaxial growth to have a thickness of, for example, about 0.5 µm, while an n-type impurity, for example, nitrogen atoms, is doped. The second n-type silicon carbide epitaxial layer 2b and the first n-type silicon carbide epitaxial layer 2a combined form the n-type silicon carbide epitaxial layer 2. Conditions of the epitaxial growth for forming the second n-type silicon carbide epitaxial layer 2b may be set so that an impurity concentration of the second n-type silicon carbide epitaxial layer 2b becomes, for example, about $8 \times 10^{15}/cm^3$.

Next, on the surface of the n-type silicon carbide epitaxial layer 2, by a photolithographic technique, a non-depicted mask having a predetermined opening is formed using, for example, an oxide film. Subsequently, by ion implantation, a p-type impurity, for example, aluminum atoms, is ion implanted. As a result, as depicted in FIG. 11, in a surface region of the n-type silicon carbide epitaxial layer 2, a shallow termination-structure-region $p^+$-type base region 4b having a depth of, for example, about 0.5 µm is formed so as to, for example, overlap a top of the deep termination-structure-region $p^+$-type base region 4a. The shallow termination-structure-region $p^+$-type base region 4b and the deep termination-structure-region $p^+$-type base region 4a combined form the termination-structure-region $p^+$-type base region 4. A dose amount at the time of ion implantation for forming the shallow termination-structure-region $p^+$-type base region 4b may be set so that, for example, an impurity concentration thereof is in a range from about $1 \times 10^{18}$ to $1 \times 10^{19}/cm^3$. Next, the mask used during the ion implantation for forming the shallow termination-structure-region $p^+$-type base region 4b is removed. The state up to here is depicted in FIG. 11.

Next, on the surface of the n-type silicon carbide epitaxial layer 2, the p-type base layer 3 is formed by epitaxial growth to have a thickness in a range, for example, from about 0.7 to 1.3 µm, while a p-type impurity, for example, aluminum atoms, is doped. Conditions of the epitaxial growth for forming the p-type base layer 3 may be set so that, for example, an impurity concentration thereof is in a range from about $1 \times 10^{16}$ to $5 \times 10^{18}/cm^3$.

Figure 12:
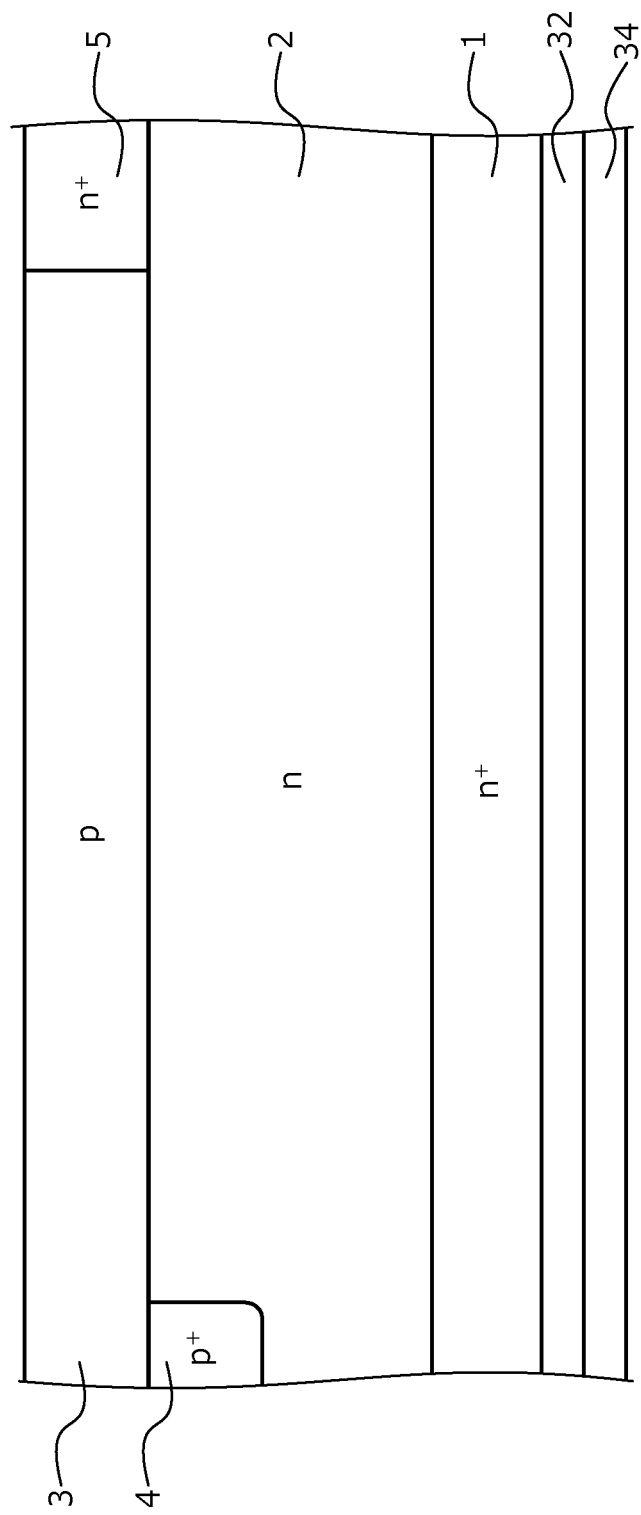
FIG. 12 is a cross-sectional view schematically depicting the termination structure region of the silicon carbide semiconductor device according to the first embodiment during manufacture.

Next, on the surface of the exposed p-type base layer 3, by a photolithographic technique, a non-depicted mask having a predetermined opening is formed using, for example, an oxide film. Subsequently, by ion implantation, an n-type impurity, for example, phosphorus, is ion implanted. As a result, as depicted in FIG. 12, in a surface region of the p-type base layer 3, the $n^+$-type channel stopper region 5 is formed. A dose amount at the time of ion implantation for forming the $n^+$-type channel stopper region 5 may be set so that, for example, an impurity concentration thereof becomes higher than that of the termination-structure-region $p^+$-type base region 4. Next, the mask used during the ion implantation for forming $n^+$-type channel stopper region 5 is removed. The state up to here is depicted in FIG. 12.

Next, heat treatment (annealing) is performed, for example, activating the termination-structure-region $p^+$-type base region 4 and the $n^+$-type channel stopper region 5. A temperature of the heat treatment may be, for example, about 1700 degrees C. A period of the heat treatment may be, for example, about 2 minutes. As described above, ion implanted regions may be collectively activated by a single session of heat treatment, or the heat treatment may be performed for each ion implantation.

Next, on the surface of the exposed p-type base layer 3, by a photolithographic technique, a non-depicted mask having predetermined openings is formed using, for example, an oxide film. Subsequently, by dry etching, the trench 17 is formed penetrating the p-type base layer 3 and reaching the n-type silicon carbide epitaxial layer 2. Subsequently, the mask used for forming the trench 17 is removed.

Next, the field oxide film 9 is formed so as to fill the trench 17. The field oxide film 9 may be formed by a method of deposition by a chemical reaction such as for a high temperature oxide (HTO).

Next, on the field oxide film 9, for example, a phosphorus glass is deposited to have a thickness of about 1 µm, forming the interlayer insulating film 23.

Next, on the second main surface of the $n^+$-type silicon carbide substrate 1, the rear electrode 32 constituted by, for example, a nickel film, is formed. Thereafter, heat treatment at a temperature of, for example, about 970 degrees C. is performed, forming an ohmic junction between the $n^+$-type silicon carbide substrate 1 and the rear electrode 32.

Next, on the surface of the rear electrode 32, for example, titanium, nickel, and gold are sequentially stacked in order stated, whereby the drain electrode pad 34 is formed. Thus, the termination structure region of the silicon carbide semiconductor device depicted in FIG. 2 is completed.

Here, although the method of manufacturing the active region and the termination structure region of the silicon carbide semiconductor device has been described separately, the active region and the termination structure region may be manufactured concurrently. For example, in the active region and the termination structure region of the first n-type silicon carbide epitaxial layer 2a, etc., structures having identical reference characters may be formed at the same process step. Further, the trench gate 18 of the active region and the trench 17 of the termination structure region may be formed at the same process step.

As described, according to the silicon carbide semiconductor device of the first embodiment, the trench structure is provided in the termination structure region. Due to the trench structure, concentration distribution of a p-type impurity decreases with increasing distance outward, enabling electric field concentration in the termination structure region to be mitigated and decreases in the breakdown voltage to be prevented. Further, since no step is present in the termination structure region, decreases in the processing accuracy at the photolithography process are suppressed.

Figure 13:
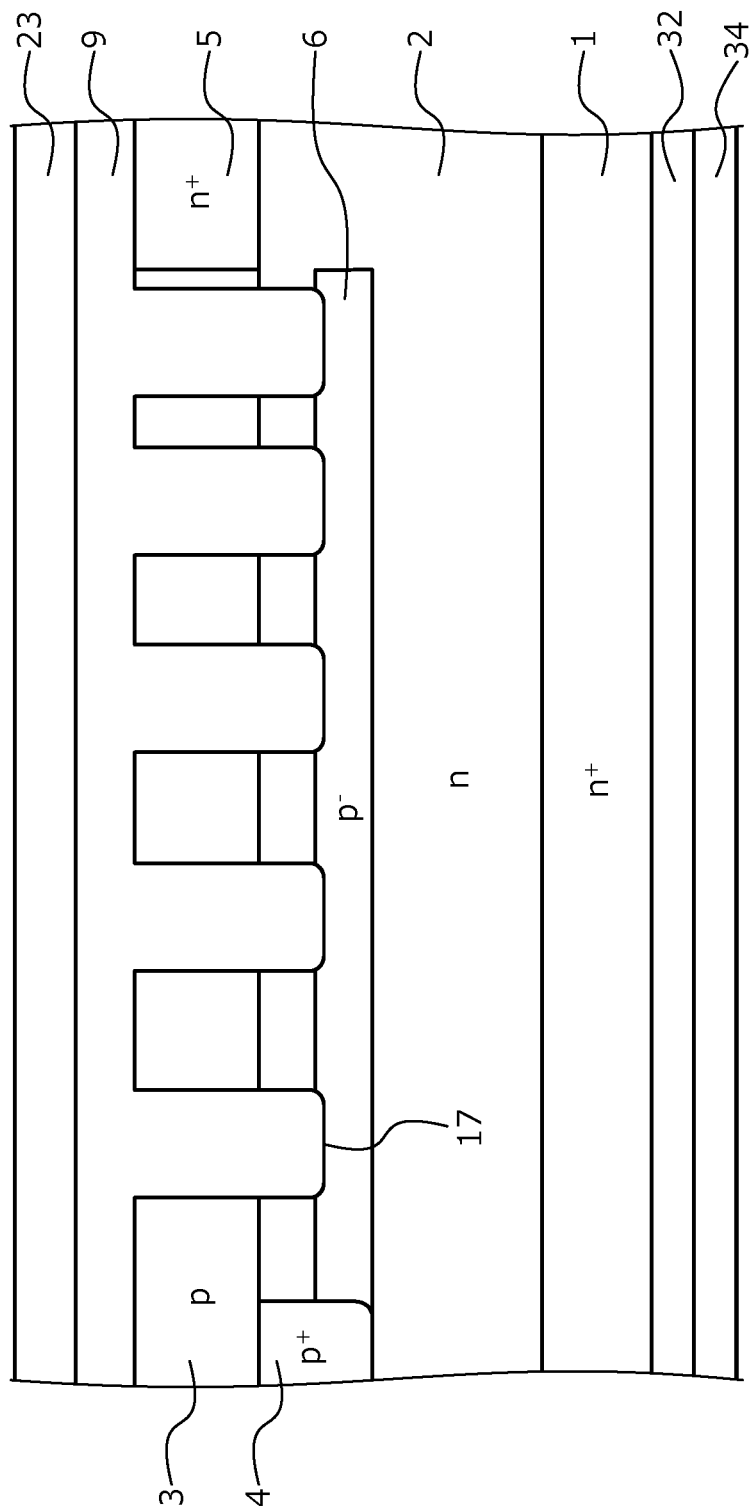
FIG. 13 is a cross-sectional view of a configuration of the termination structure region of the silicon carbide semiconductor device according to a second embodiment.

FIG. 13 is a cross-sectional view of a configuration of the termination structure region of the silicon carbide semiconductor device according to a second embodiment. The active region of the silicon carbide semiconductor device according to the second embodiment has a configuration similar to that of the first embodiment. In the termination structure region, the second embodiment differs from the first embodiment in that a first junction termination extension (JTE) region (third semiconductor region of the second conductivity type) 6 is provided in the n-type silicon carbide epitaxial layer 2. The first JTE region 6 is in contact with the termination-structure-region $p^+$-type base region 4 in a lateral direction (width direction of the trench 17), is positioned under the trenches 17 (toward the rear electrode 32), and is separated from the p-type base layer 3. The first JTE region 6 is provided having an impurity concentration lower than that of the p-type base layer 3.

A method of manufacturing the silicon carbide semiconductor device according to the second embodiment will be described. The active region of the silicon carbide semiconductor device according to the second embodiment may be formed by the same method as in the first embodiment.

Figure 14:
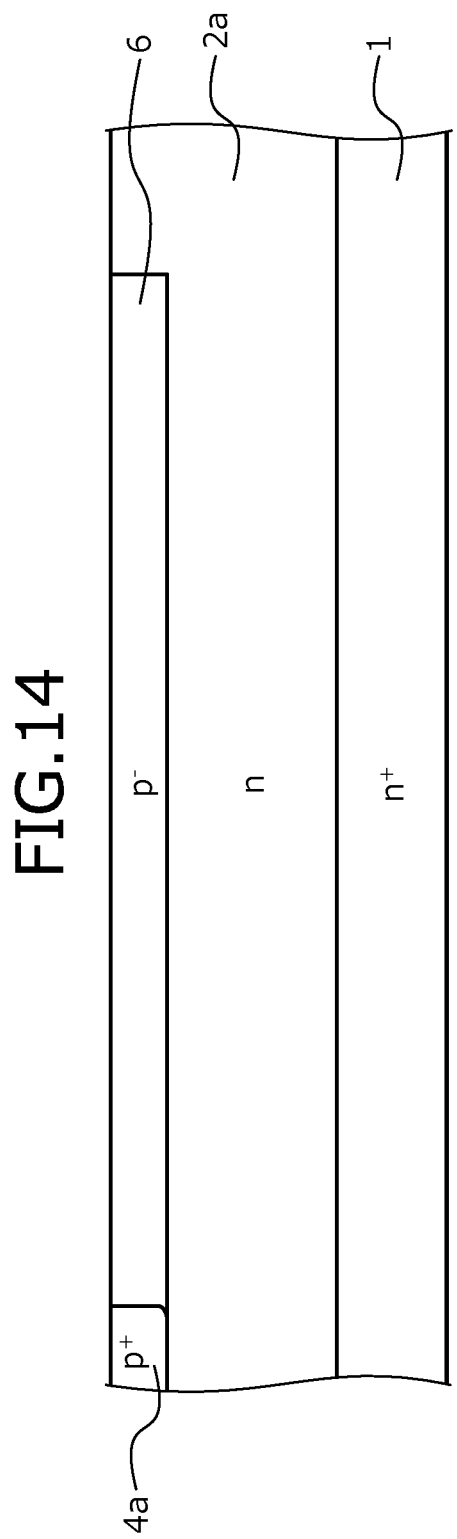
FIG. 14 is a cross-sectional view schematically depicting the termination structure region of the silicon carbide semiconductor device according to the second embodiment during manufacture.

FIG. 14 is a cross-sectional view schematically depicting the termination structure region of the silicon carbide semiconductor device according to the second embodiment during manufacture. First, similarly to the first embodiment, the processes up to forming the deep termination-structure-region p$^+$-type base region 4a are performed.

Next, on the surface of the first n-type silicon carbide epitaxial layer 2a, by a photolithographic technique, a non-depicted mask having a predetermined opening is formed using, for example, an oxide film. Subsequently, by ion implantation, a p-type impurity, for example, aluminum atoms, is ion implanted. As a result, in a surface region of the first n-type silicon carbide epitaxial layer 2a, the first JTE region 6 is formed having a depth of, for example, about 0.5 µm. Further, a dose amount at the time of ion implantation for forming the first JTE region 6 may be set so that, for example, an impurity concentration thereof is in a range from about $5\times10^{16}$ to $1\times10^{18}$/cm$^3$. Next, the mask used during the ion implantation for forming the first JTE region 6 is removed. The state up to here is depicted in FIG. 14.

Thereafter, in the same method of manufacturing as in the first embodiment, from the process of forming the second n-type silicon carbide epitaxial layer 2b by epitaxial growth to the process of forming the drain electrode pad 34 are performed, whereby the termination structure region of the silicon carbide semiconductor device depicted in FIG. 13 is completed.

As described, the silicon carbide semiconductor device according to the second embodiment has effects similar to those of the first embodiment. Furthermore, in the second embodiment, since the first JTE region is provided under the trenches, electric field concentration at the trench bottoms may be mitigated, enabling the breakdown voltage of the termination structure region to be improved over the first embodiment.

Figure 15:
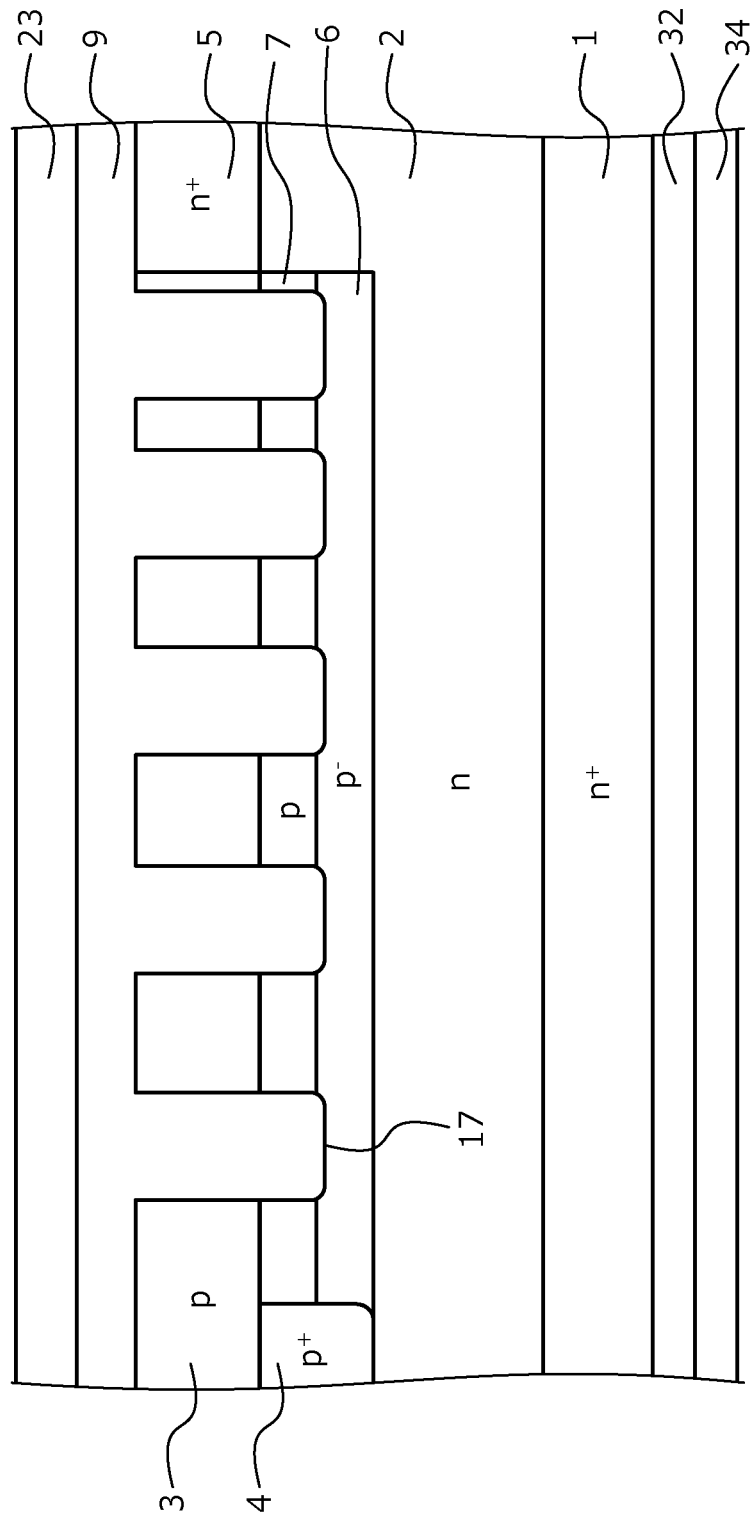
FIG. 15 is a cross-sectional view of a configuration of the termination structure region of the silicon carbide semiconductor device according to a third embodiment.

FIG. 15 is a cross-sectional view of a configuration of the termination structure region of the silicon carbide semiconductor device according to a third embodiment. The active region of the silicon carbide semiconductor device according to the third embodiment has a configuration similar to that of the first embodiment. In the termination structure region, the third embodiment differs from the second embodiment in that a second JTE region (fourth semiconductor region of the second conductivity type) 7 is provided at a surface side of the n-type silicon carbide epitaxial layer 2, the second JTE region 7 being in contact with the termination-structure-region p$^+$-type base region 4 in the lateral direction (width direction of the trench 17), being in contact with the p-type base layer 3 in an upward direction (toward the interlayer insulating film 23), and being in contact with the first JTE region 6 in a downward direction (toward the rear electrode 32). The second JTE region 7 is provided having an impurity concentration that is lower than that of the termination-structure-region p$^+$-type base region 4.

A method of manufacturing the silicon carbide semiconductor device according to the third embodiment will be described. The active region of the silicon carbide semiconductor device according to the third embodiment may be formed by the same method as in the first embodiment.

Figure 16:
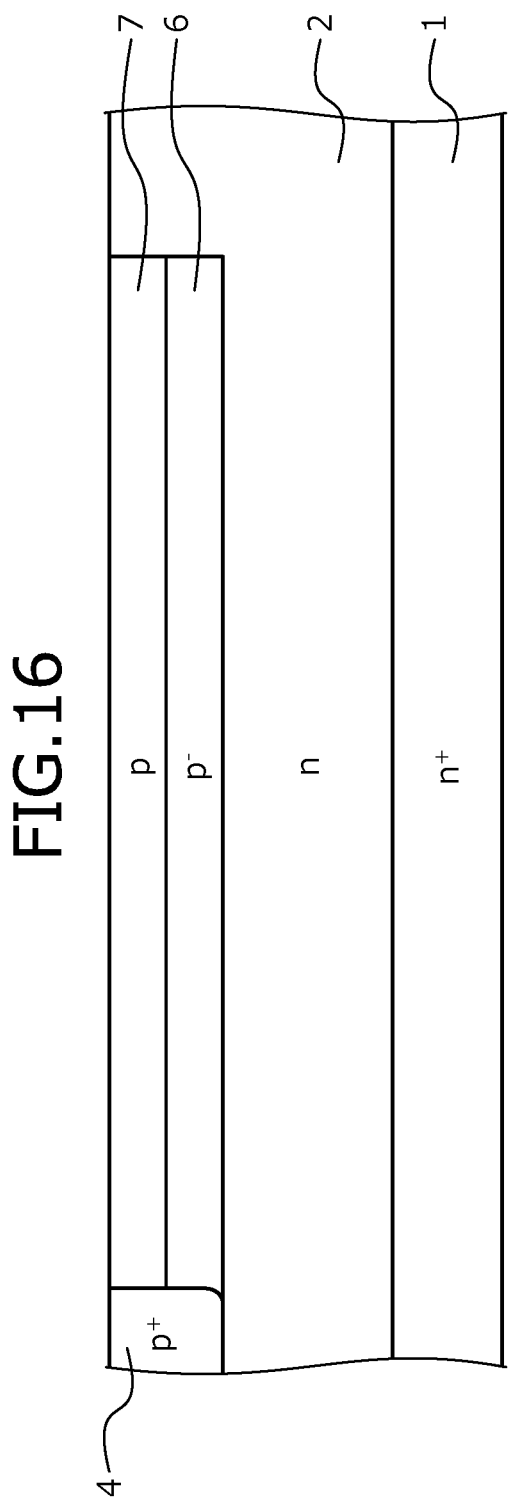
FIG. 16 is a cross-sectional view schematically depicting the termination structure region of the silicon carbide semiconductor device according to the third embodiment.

FIG. 16 is a cross-sectional view schematically depicting the termination structure region of the silicon carbide semiconductor device according to the third embodiment. First, similarly to the second embodiment, the processes up to forming the second n-type silicon carbide epitaxial layer 2b by epitaxial growth are performed.

Next, on the surface of the second n-type silicon carbide epitaxial layer 2b, by a photolithographic technique, a non-depicted mask having predetermined openings is formed using, for example, an oxide film. Subsequently, by ion implantation, a p-type impurity, for example, aluminum atoms, is ion implanted. As a result, in some surface regions of the second n-type silicon carbide epitaxial layer 2b, the second JTE region 7 is formed having a depth of, for example, about 0.5 µm. Further, a dose amount at the time of ion implantation for forming the second JTE region 7 may be set so that, for example, an impurity concentration thereof is in a range from about $5\times10^{16}$ to $1\times10^{18}$/cm$^3$. Next, the mask used during the ion implantation for forming the second JTE region 7 is removed. The state up to here is depicted in FIG. 16.

Thereafter, in the same method of manufacturing as in the second embodiment, from the process of forming the p-type base layer 3 by epitaxial growth to the process of forming the drain electrode pad 34 are performed, whereby the termination structure region of the silicon carbide semiconductor device depicted in FIG. 15 is completed.

As described, the silicon carbide semiconductor device according to the third embodiment has effects similar to those of the first embodiment. Furthermore, in the third embodiment, since the second JTE region is provided, distribution of the p-type impurity in the depth direction may be made to be gradual and electric field concentration at the termination structure region may be mitigated.

FIG. 17 is a cross-sectional view of a configuration of the termination structure region of the silicon carbide semiconductor device according to the fourth embodiment. The active region of the silicon carbide semiconductor device according to the fourth embodiment has a configuration similar to that of the first embodiment. In the termination structure region, the fourth embodiment differs from the first embodiment in that a third JTE region (fifth semiconductor region of the second conductivity type) 8 is selectively provided in plural in the n-type silicon carbide epitaxial layer 2, the third JTE regions 8 being positioned under the trenches 17 (toward the rear electrode 32) and separated from the p-type base layer 3. The third JTE regions 8 have an impurity concentration about equal to that of the termination-structure-region p$^+$-type base region 4 and are provided at intervals that decrease with increasing distance of the third JTE regions 8 from the active region.

A method of manufacturing the silicon carbide semiconductor device according to the fourth embodiment will be described. The active region of the silicon carbide semiconductor device according to the fourth embodiment may be formed by the same method as in the first embodiment.

FIG. 18 is a cross-sectional view schematically depicting the termination structure region of the silicon carbide semiconductor device according to the fourth embodiment during manufacture. First, similarly to the first embodiment, the processes up to forming the first n-type silicon carbide epitaxial layer 2a by epitaxial growth are performed.

Next, as depicted in FIG. 18, on the surface of the first n-type silicon carbide epitaxial layer 2a, by a photolithographic technique, a non-depicted mask having predetermined openings is formed using, for example, an oxide film. Subsequently, by ion implantation, a p-type impurity, for example, aluminum atoms, is ion implanted. As a result, as depicted in FIG. 18, in some surface regions of the first n-type silicon carbide epitaxial layer 2a, the deep termination-structure-region p$^+$-type base region 4a and the plural third JTE regions 8 are formed at a depth of, for example, about 0.5 μm. Further, a dose amount at the time of ion implantation for forming the deep termination-structure-region p+-type base region 4a and the plural third JTE regions 8 may be set so that, for example, impurity concentrations thereof are in a range from about $1\times10^{18}$ to $1\times10^{19}$/cm$^3$. Next, the mask used during the ion implantation for forming the deep termination-structure-region p+-type base region 4a and the plural third JTE regions 8 is removed. The state up to here is depicted in FIG. 18.

Thereafter, in the same method of manufacturing as in the first embodiment, from the process of forming the second n-type silicon carbide epitaxial layer 2b by epitaxial growth to the process of forming the drain electrode pad 34 are performed, whereby the termination structure region of the silicon carbide semiconductor device depicted in FIG. 17 is completed.

As described, the silicon carbide semiconductor device according to the fourth embodiment has effects similar to those of the first embodiment. Furthermore, in the fourth embodiment, since the third JTE region is provided, concentration distribution of a p-type impurity decreases with increasing distance outward, enabling electric field concentration in the termination structure region to be mitigated and decreases in the breakdown voltage to be prevented to a greater extent than in the first embodiment.

In the embodiments of the present invention, while a case in which a MOS is configured on a (0001) plane of a silicon carbide substrate containing silicon carbide and having the (0001) plane as a main surface has been described as an example, without limitation hereto, various changes are possible, such as in the wide bandgap semiconductor material, orientation of the main surface of the substrate, etc.

Further, in the embodiments of the present invention, while the first conductivity type is assumed to be an n-type and the second conductivity type is assumed to be a p-type, the present invention is similarly implemented when the first conductivity type is a p-type and the second conductivity type is an n-type.

According to the embodiments of the present invention, a trench structure is provided in the termination structure region. Due to the trench structure, distribution of a p-type impurity decreases with increasing distance outward, enabling electric field concentration in the termination structure region to be mitigated and decreases in the breakdown voltage to be prevented. Further, since no step is present in the termination structure region, decreases in the processing accuracy at the photolithography process are suppressed.

The semiconductor device and the method of manufacturing a semiconductor device according to the embodiments of the present invention achieve an effect in that breakdown voltage may be improved and decreases in processing accuracy at a photolithography process may be suppressed.

As described, the semiconductor device according to the embodiments of the present invention is useful for high-voltage semiconductor devices used in power converting equipment and power supply devices such as in industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
an active region through which current flows; and
a termination structure region disposed outside the active region and in which a termination structure is formed, wherein
the termination structure region includes:
  a semiconductor substrate of a first conductivity type;
  a first semiconductor layer provided on a front surface of the semiconductor substrate, the first semiconductor layer having an impurity concentration lower than an impurity concentration of the semiconductor substrate;
  a second semiconductor layer of a second conductivity type provided on a first side of the first semiconductor layer, opposite to a second side thereof, said second side facing the semiconductor substrate;
  a plurality of trenches penetrating the second semiconductor layer;
  a first semiconductor region of the second conductivity type provided in the first semiconductor layer at said first side, the first semiconductor region being in contact with the second semiconductor layer, and being disposed at a side closer to the active region, the first semiconductor region having an impurity concentration higher than an impurity concentration of the second semiconductor layer;
  a second semiconductor region of the first conductivity type provided in the second semiconductor layer, the second semiconductor region being disposed outside and adjacent to one of the plurality of trenches, the one of the plurality of trenches being disposed at a farthest position from the active region; and
  a third semiconductor region of the second conductivity type provided in the first semiconductor layer, and contacting a side surface of the first semiconductor region in a lateral direction, the third semiconductor region being disposed under the plurality of trenches, and being spaced from the second semiconductor layer, the third semiconductor region having an impurity concentration lower than the impurity concentration of the first semiconductor region.

2. The semiconductor device according to claim 1, further comprising
a fourth semiconductor region of the second conductivity type contacting the side surface of the first semiconductor region in the lateral direction, the fourth semiconductor region having an upper side and a lower side, and being disposed between the third semiconductor region and the second semiconductor layer, the upper side of the fourth semiconductor region contacting the second semiconductor layer and the lower side of the fourth semiconductor region contacting the third semiconductor region, the fourth semiconductor region having an impurity concentration lower than the impurity concentration of the first semiconductor region.

3. The semiconductor device according to claim 1, further comprising
a plurality of fifth semiconductor regions of the second conductivity type selectively provided in the first semiconductor layer to be respectively positioned under each trench of the plurality of trenches and separated from the second semiconductor layer, the plurality of fifth semiconductor regions having an impurity concentration that is equal to the impurity concentration of the first semiconductor region.

4. The semiconductor device according to claim 1, wherein the plurality of trenches is provided so that an interval between adjacent trenches decreases with increasing distance of the trenches from the active region.

5. The semiconductor device according to claim 1, further comprising an insulating film embedded in each trench of the plurality of trenches.

6. A method of manufacturing a semiconductor device having an active region through which current flows, and a termination structure region disposed outside the active region and in which a termination structure is formed, the method comprising:
   forming a first semiconductor layer of a first conductivity type on a front surface of a semiconductor substrate of the first conductivity type, the first semiconductor layer having an impurity concentration lower than an impurity concentration of the semiconductor substrate;
   forming a first semiconductor region of a second conductivity type at the termination structure region, the first semiconductor region being formed in the first semiconductor layer at a first side thereof, the first side being opposite to a second side of the first semiconductor layer, the second side facing the semiconductor substrate;
   forming a second semiconductor layer of the second conductivity type on the first side of the first semiconductor layer;
   forming a second semiconductor region of the first conductivity type in the second semiconductor layer at the termination structure region, at a position separated from the active region, the first semiconductor region being formed at a position closer to the active region than is the second semiconductor region;
   forming a trench in a region in which the first semiconductor region-is not formed, the trench penetrating the second semiconductor layer; and
   forming a third semiconductor region of the second conductivity type in the first semiconductor layer so as to be in contact with a side surface of the first semiconductor region in a lateral direction, the third semiconductor region having an impurity concentration lower than an impurity concentration of the first semiconductor region.

7. The method according to claim 6, further comprising forming a fourth semiconductor region of the second conductivity type directly on the third semiconductor region in the first semiconductor layer so as to be in contact with the side surface of the first semiconductor region in the lateral direction, the fourth semiconductor region having an impurity concentration lower than the impurity concentration of the first semiconductor region.

8. The method according to claim 6, further comprising selectively forming a fifth semiconductor region of the second conductivity type in the first semiconductor layer, the fifth semiconductor region having an impurity concentration equal to an impurity concentration of the first semiconductor region.

9. The method according to claim 8, wherein the fifth semiconductor region is formed at a same process as the first semiconductor region.

10. The method according to claim 6, further comprising forming a trench gate in the active region, wherein
   forming a trench includes forming the trench in the termination structure region.

* * * * *